United States Patent
Oda

(10) Patent No.: US 6,609,231 B2
(45) Date of Patent: Aug. 19, 2003

(54) APPARATUS AND METHOD FOR AUTOMATICALLY VERIFYING A DESIGNED CIRCUIT

(75) Inventor: Takahiro Oda, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/984,154

(22) Filed: Oct. 29, 2001

(65) Prior Publication Data

US 2002/0133796 A1 Sep. 19, 2002

(30) Foreign Application Priority Data

Mar. 14, 2001 (JP) .......................................... 2001-71992

(51) Int. Cl.[7] .............................................. G06F 17/50
(52) U.S. Cl. ...................... 716/5; 716/1; 716/3; 716/4
(58) Field of Search .............................. 716/5, 1, 6, 17, 716/3, 4; 700/121

(56) References Cited

U.S. PATENT DOCUMENTS

| | | | | |
|---|---|---|---|---|
| 5,808,896 A | * | 9/1998 | Weber | 716/11 |
| 5,933,356 A | * | 8/1999 | Rostoker et al. | 703/15 |
| 6,044,211 A | * | 3/2000 | Jain | 716/18 |
| 6,272,671 B1 | * | 8/2001 | Fakhry | 716/18 |

* cited by examiner

*Primary Examiner*—Vuthe Siek
*Assistant Examiner*—Magid Y Dimyan
(74) *Attorney, Agent, or Firm*—McDermott, Will & Emery

(57) ABSTRACT

This invention provides an apparatus and a method for automatically verifying a designed semiconductor integrated circuit (LSI). The apparatus verifies a circuit generated by a generator for generating a circuit diagram of the whole LSI in accordance with the arrangement of basic cells which define a predetermined circuit unit. At least one of basic cells includes a verification symbol specifying a name and verification contents of a node to be verified. The apparatus analyzes a circuit diagram of the whole LSI generated in accordance with the arrangement having a cell including verification symbols to extract names and verification contents of the nodes to be verified, generates a verification pattern in accordance with the extracted node name and verification contents, executes a circuit simulation by using the verification pattern, analyzes the simulation result, and determines whether a the verified node is accepted or rejected.

20 Claims, 14 Drawing Sheets

TO BE CONNECTED TO FIRST
SIGNAL TO BE MEASURED

TO BE CONNECTED TO SECOND
SIGNAL TO BE MEASURED

APPARATUS AND METHOD FOR AUTOMATICALLY VERIFYING A DESIGNED CIRCUIT

BACKGROUND OF THE INVENTION

1. Field of the Invention

The present invention relates to an apparatus and a method for verifying a designed semiconductor integrated circuit, particularly to an verifying apparatus for automatically determining whether changes of voltages and currents meet predetermined conditions for the designed circuit.

2. Description of the Related Art

As a semiconductor integrated circuit (LSI) has been recently increased in size and integration degree, various apparatuses are developed to support circuit design and verification.

For example, FIG. 14 shows an automatic circuit designing apparatus for designing and verifying a semiconductor integrated circuit. For the apparatus shown in FIG. 14, a designer uses a plurality of prepared basic cells 251 for defining a predetermined circuit pattern as parts and supplies a generator 201 with the parts and a generation parameter 250 corresponding to a specification of a design circuit. The generator 201 generates a circuit schematic (circuit diagram) 252 of the whole circuit in accordance with the supplied generation parameter 250 by tiling with the basic cells.

Then, the designer generates a verification pattern 254 while referring to the circuit schematic thus generated and confirming the name of a signal to be verified. A circuit simulation is executed by a circuit simulator 202 by using the verification pattern 254 to generate a simulation result 255. Then, the designer visually confirms the result and determines whether each circuit meets a desired specification.

As described above, a verification pattern used for a circuit simulation is manually generated by a designer. To execute the circuit simulation, the name of a signal to be verified is necessary. However, the signal name cannot be known before the circuit schematic 252 is generated by the generator 201. Therefore, it is necessary for the designer to generate the verification pattern 254 for the circuit simulator 202 after generating the circuit schematic 252 and then, referring to the circuit schematic 252 to examine the signal name. Therefore, when a circuit pattern to be designed is different, the designer must generate the verification pattern 254 every circuit pattern and the work load increases.

Moreover, because acceptance or rejection of the simulation result 255 is manually determined by a designer, there is a problem that an error occurs or the designer is burdened.

As a semiconductor integrated circuit has been recently increased in size and integration degree, the circuit has been further complicated and sophisticated and it is estimated that the load of the designer under operations is further increased in future. Therefore, it is requested to automate the operations.

SUMMARY OF THE INVENTION

The present invention is made to solve the above problems and its object is to provide an apparatus for automatically verifying a designed circuit in automatic circuit designing of a semiconductor integrated circuit.

In a first aspect of the invention, an apparatus is provided for automatically verifying a circuit which is generated by a generator for generating a circuit diagram of a whole semiconductor integrated circuit in accordance with an arrangement of cells which are regarded as parts. Each cell defines a predetermined circuit unit.

A verification symbol which specifies a node name and a verification content for a node to be verified is inserted in advance into at least one of the cells arranged as parts. The apparatus comprises verification-condition extracting section, pattern generating section and acceptance/rejection determining section.

The verification-condition extracting section analyzes a circuit diagram of the whole semiconductor integrated circuit generated in accordance with the arrangement of cells including at least one verification symbol, and extracts the node name and the verification content of the node to be verified. The pattern generating section generates a verification pattern to be used for verification from the extracted node name and verification content. The acceptance/rejection determining section executes a circuit simulation by using the verification pattern, analyzes the simulation result, and determines whether the verified node is of acceptance or rejection.

Thus, the circuit verification can be done automatically, the work load of a designer can be reduced, and an error in the work of the designer can be prevented.

In the apparatus, the acceptance/rejection determining section may output a report including a determination result indicative of acceptance or rejection. Thus it becomes easier to perceive a determination result.

The apparatus further may comprise display section for highlighting rejected portions in the whole circuit in accordance with a determination result from the acceptance/rejection determining section for display. Thereby, rejected portions are easily recognized.

In the apparatus, in order to verify a skew between two signals connected to two nodes included in the same cell, the verification symbol may have a first connection terminal to be connected to one of the signals and a second connection terminal to be connected to the other of the signals. Thereby, verification between two signals is realized.

In the apparatus, in order to verify a signal to be connected to two nodes included in different cells, the verification symbol may have a first connection terminal to be connected to a signal to be measured in a cell into which the verification symbol is inserted and a second connection terminal for specifying a signal to be measured in another cell into which the verification symbol is not inserted. In this case, a virtual symbol name to specify a signal to be connected can be defined on the second connection terminal. Thereby, it is possible to verify signals to be connected to two nodes included in different cells.

In the apparatus, the verification symbol may have a connection terminal for designating predetermined waveform data to be compared with a signal to be measured. Thus it becomes possible to compare with any waveform data which have already been obtained.

In the apparatus, the verification symbol may have a connection terminal to be connected to a predetermined signal which is used as a signal providing a reference potential. Thereby, it is possible to use any one of signals as the reference potential.

In the apparatus, the verification symbol may measure a period in which voltage difference between two signals to be compared in verification becomes a predetermined value or more, and determine acceptance or rejection in accordance with whether the length of period is equal to or shorter than a predetermined length. Thus, secure determination can be realized.

In the apparatus, the verification symbol may have a terminal to be connected to an instance in order to verify a current flowing through the instance. Thus, it becomes possible to verify the instance.

In a second aspect of the invention, an apparatus is provided for automatically verifying a semiconductor integrated circuit specified in accordance with circuit information. At least one verification symbol which specifies a node name and a verification content for a node to be verified in the circuit is inserted in advance into the circuit information of the semiconductor integrated circuit. The apparatus comprises verification-condition extracting section, pattern generating section, and acceptance/rejection determining section.

The verification-condition extracting section analyzes a circuit information including the verification symbol, and extracts the node name and verification content of the node to be verified.

The pattern generating section generates a verification pattern to be used for verification from the extracted node name and verification content.

The acceptance/rejection determining section executes a circuit simulation by using the verification pattern, analyzes the simulation result, and determines whether the verified node is of acceptance or rejection.

Thus, the circuit verification can be done automatically, the work load of a designer can be reduced, and an error in the work of the designer can be prevented.

In a third aspect of the invention, provided is a method of automatically verifying a designed circuit which is generated by a generator for generating a circuit diagram of a whole semiconductor integrated circuit in accordance with an arrangement of cells which are regarded as parts, each cell defining a predetermined circuit unit. A verification symbol which specifies a node name and a verification content for a node to be verified is inserted in advance into at least one of the cells arranged as parts. The method comprises analyzing a circuit diagram of the whole semiconductor integrated circuit generated in accordance with the arrangement of cells including at least one verification symbol, and extracting the node name and the verification content of the node to be verified, generating a verification pattern to be used for verification from the extracted node name and verification content, and executing a circuit simulation by using the verification pattern and then analyzing the simulation result to determine whether the verified node is of acceptance or rejection.

In a fourth aspect of the invention, provided is a method of automatically verifying a designed semiconductor integrated circuit specified in accordance with circuit information. At least one verification symbol which specifies a node name and a verification content for a node to be verified in the circuit is inserted in advance into the circuit information of the semiconductor integrated circuit. The method comprises analyzing a circuit information including the verification symbol, and extracting the node name and verification content of the node to be verified, generating a verification pattern to be used for verification from the extracted node name and verification content, and executing a circuit simulation by using the verification pattern and then analyzing the simulation result to determine whether the verified node is of acceptance or rejection.

DETAILED DESCRIPTION OF THE INVENTION

Embodiments of an apparatus for verifying automatically a designed circuit according to the present invention are described below in detail by referring to the accompanying drawings.

First Embodiment (Configuration of the Verifying Apparatus)

Figure 1:
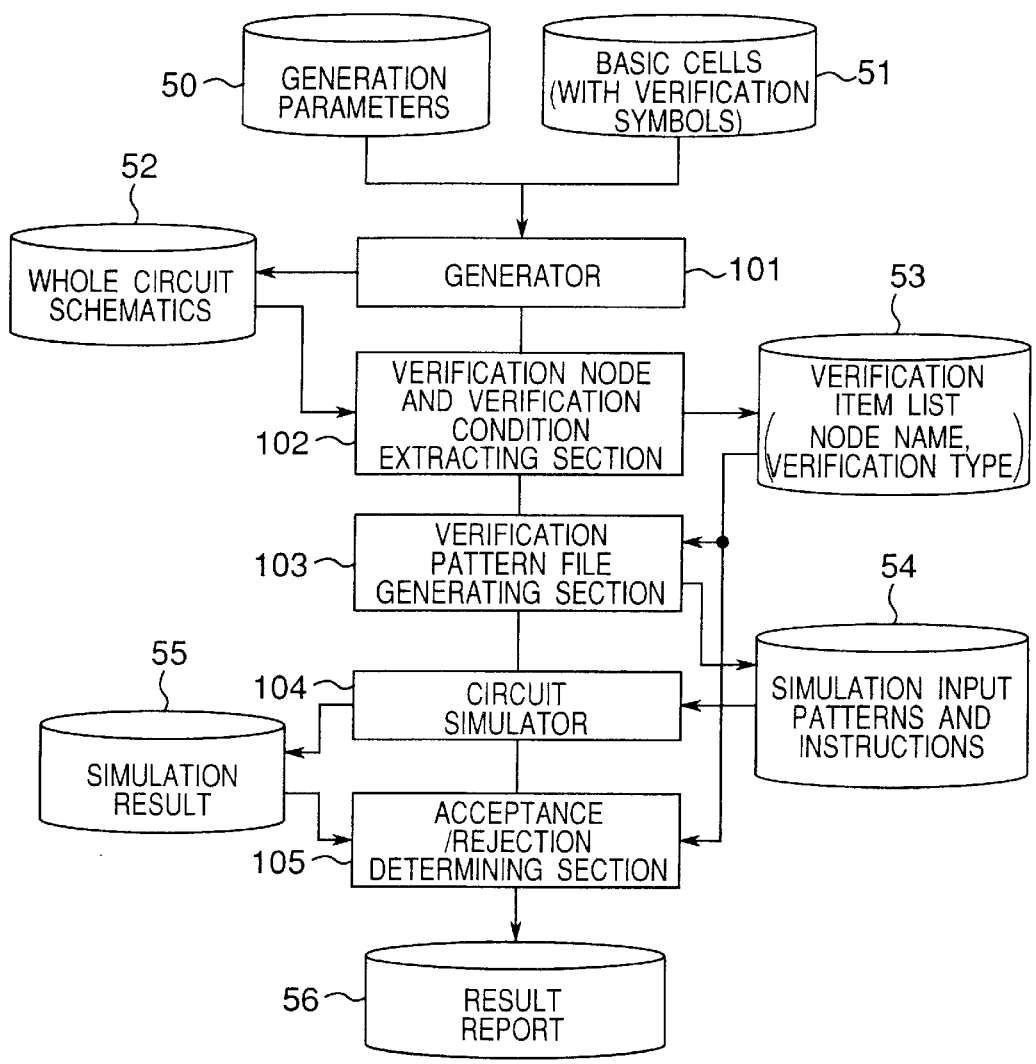
FIG. 1 is a block diagram of an verifying apparatus of the present invention (first embodiment).

FIG. 1 is an illustration showing a functional configuration of an apparatus for automatically verifying a designed circuit of the present invention. The verifying apparatus includes a generator 101 for generating a circuit schematic (circuit diagram) in accordance with input circuit information, a verification node and verification condition extracting section 102 for analyzing the circuit schematic and generating a verification item list 53 including contents of verification and objects to be verified, a verification pattern file generating section 103 for generating a verification pattern 54 for a circuit simulation, a circuit simulator 104 for executing the circuit simulation, and an acceptance/rejection determining section 105 for determining a simulation result.

Figure 2:
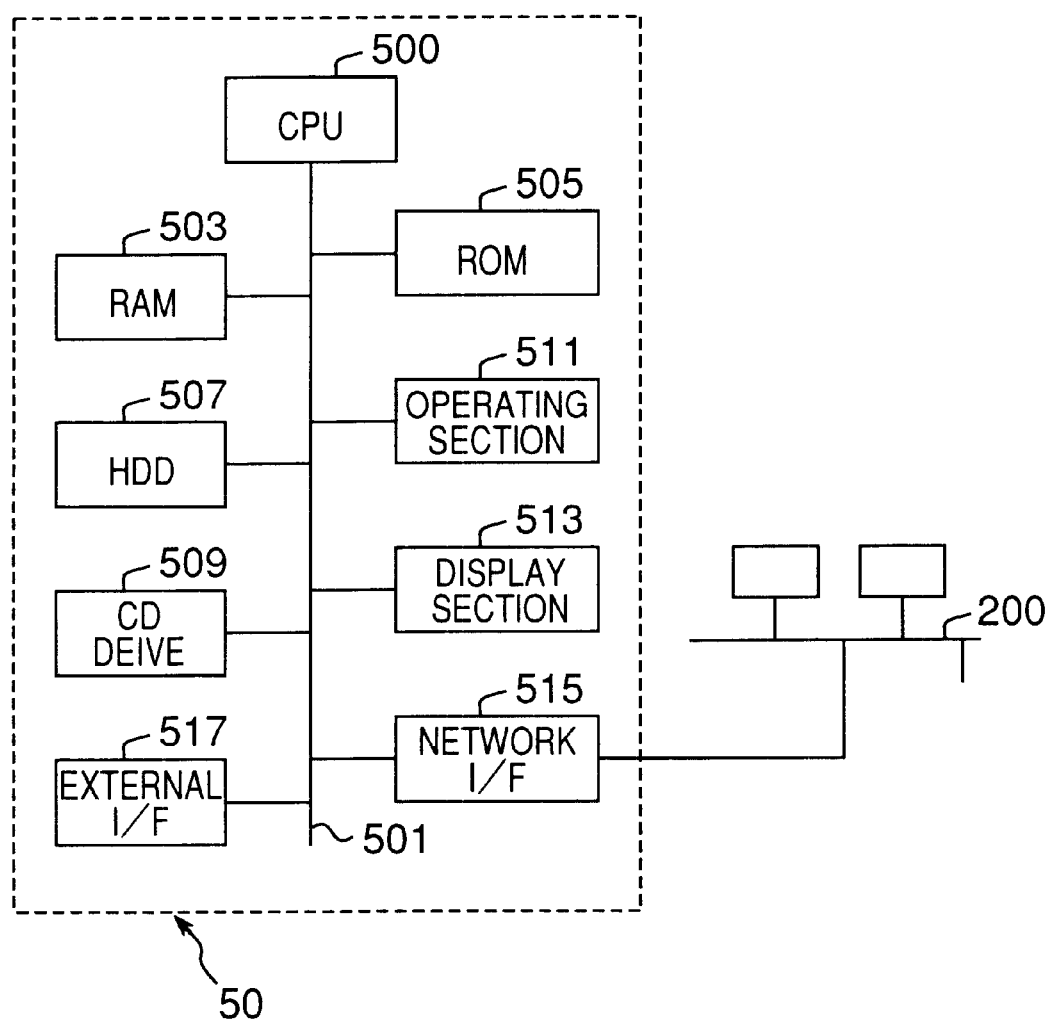
FIG. 2 is a block diagram of hardware configuration of an verifying apparatus of the present invention.

In this case, the verifying apparatus can be realized with an information processor (computer) having the hardware configuration shown in FIG. 2. The information processor 50 has a CPU (Central Processing Unit) 500 for executing a program. The CPU 500 is connected to, through a bus 501, a RAM (Random Access Memory) 503, a ROM (Read Only Memory) 505 for storing programs, a display section 513 for displaying information, operating section 511 which comprises a keyboard and a mouse and is operated by a user, a network interface section 515 to connect to a network, and an external interface section 517 to connect to other information processor through a communication line 200. Moreover, the information processor 50 is provided with a hard disk device 507 serving as an auxiliary memory and a CD drive 509 for reading programs and data from a CD-ROM serving as an information recording medium. In this case, functions of the verifying apparatus shown in FIG. 1 are realized when the CPU 500 of the information processor 50 executes predetermined programs stored in the RAM 503 and ROM 505.

Turning to FIG. 1 again, circuit design information to be input to the generator 101 is described. The circuit design information includes a generation parameter 50 set by a designer in accordance with the specification of a design circuit and a group of basic cells 51 tiled as parts in accordance with the contents of a circuit to be designed.

The generation parameter 50 includes the information about a memory size and an IO bus width when a circuit to be designed is a memory.

A basic cell generally composes several gates and defines a circuit unit functionally as a unity. For example, a circuit composing a sense amplifier is defined as one basic cell or a larger control circuit block is defined as one cell. A plurality of basic cells are prepared. Reuse of a basic cell for circuit design can make design operations more efficient. A designer designs the whole circuit by properly combining some of these basic cells 51 as parts and disposing them as tiling in accordance with the specification of a design circuit.

Particularly, in the case of this embodiment, a verification symbol for designating the verification content of a signal (or node) to be verified is added to a basic cell. That is, when there is a signal (or node) to be verified in a circuit included in a basic cell, a verification object to be verified is specified by connecting the verification symbol to the signal. In this case, the verification symbol defines not only the verification object but also verification contents. A designer can incorporate information about the verification object and verification contents in a circuit design stage, by arranging these basic cells as parts and designing the whole circuit.

Figure 3A:
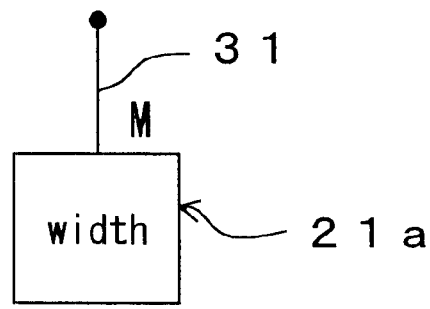
FIG. 3A is an illustration for explaining an example of a verification symbol.
Figure 3B:
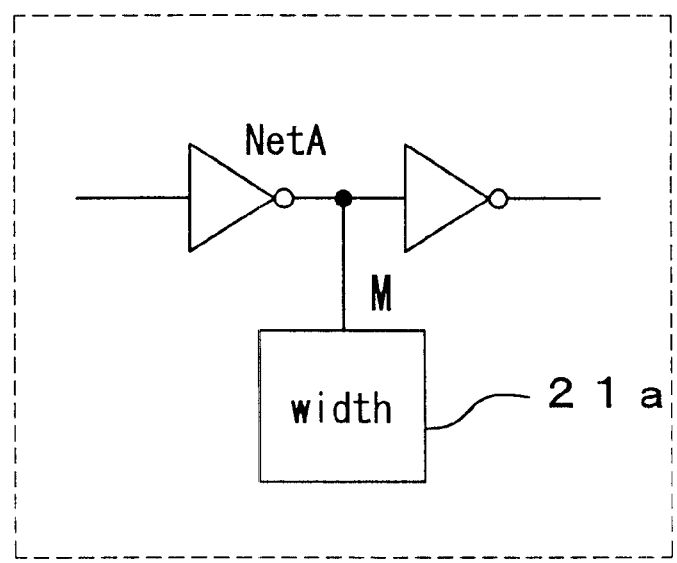
FIG. 3B is an illustration showing a basic cell into which a verification symbol is inserted.

FIG. 3A shows an examples of a verification symbol. FIG. 3B shows a verification symbol 21a connected with a signal to be verified in a basic cell. The verification symbol 21a has a connection terminal 31 to be connected with a signal to be verified (a signal not to be measured) to specify the signal and defines the type of the verification of the signal and the acceptance/rejection determining conditions of a verification result. In this case, the type of verification denotes measurement contents of a connected signal. For example, the contents include the rise time and fall time of a signal, the time until a signal falls after the signal rises, and the time until a signal rises after the signal falls. The acceptance/rejection determining conditions include a determination value serving as a threshold value used for determination and comparison conditions of the determination value and a measured value. The comparison conditions include: determination value>measured value; determination value<measured value; determination value≧measured value; and determination value≦measured value. When the relation between a determination value and a measured value meets a comparison condition, it is determined to be acceptance. By connecting a symbol to a signal which is to be measured in a basic cell in advance, the name of a signal to be verified is obtained when the whole circuit is generated later. Verifying a signal is the same as verifying a node and a net to which the signal is connected. Therefore, when defining a signal name for a verification symbol as a verification object, it is also permitted to designate a node name and a net name instead of a signal name.

(Operations of the Verifying Apparatus)

Operations for automatic verification of an LSI circuit by the verifying apparatus are described below.

In the case of the verifying apparatus, the generator 101 generates a hierarchical circuit diagram (whole circuit schematic) 52 in accordance with a group of basic cells arranged by a designer and a generation parameter set in accordance with the specification of an LSI.

The verification node and verification condition extracting section 102 inspects the generated circuit diagram starting with top of the hierarchy. When the section 102 detects a basic cell including a verification symbol in the circuit diagram, it generates a verification item list 53 by using the name of a signal (or node or net) to which the verification symbol is connected and the verification-content information defined in the verification symbol. The verification item list 53 is a file which defines a net name to be verified in a circuit diagram obtained from each verification symbol, a type of verification to the net, and acceptance/rejection determining conditions.

Figure 4:
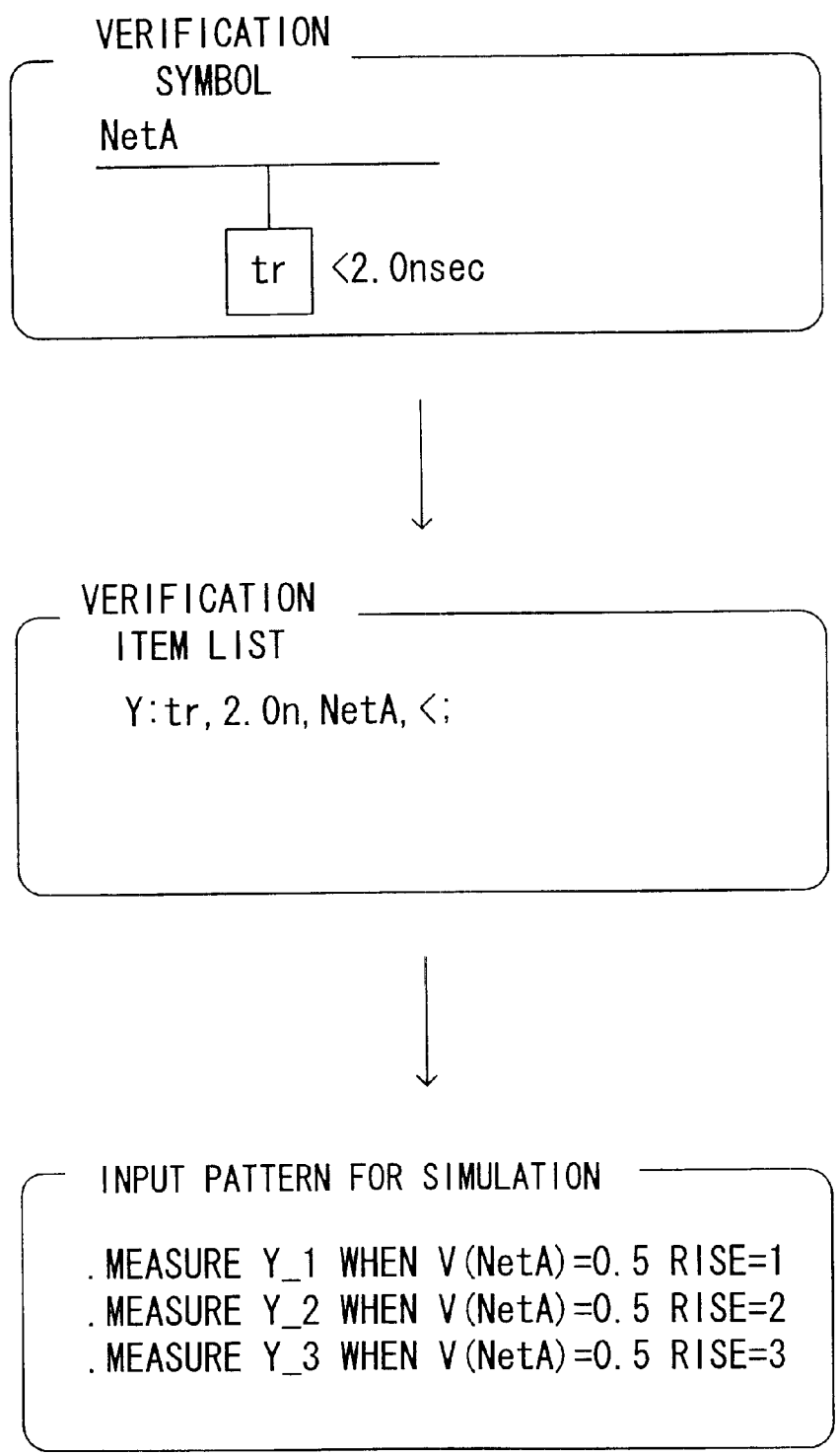
FIG. 4 is an illustration for explaining development from a verification symbol to verification item list and simulation input pattern.

The verification-pattern-file generating section 103 reads the generated verification item list 53 and generates a simulation input pattern 54 for a circuit simulator necessary for measurement of a signal to be verified. FIG. 4 shows an example when a verification symbol is developed into a verification item and a simulation input pattern. The description in FIG. 4 is according to an HSPICE format.

The circuit simulator 104 executes a circuit simulation by using the generated simulation pattern 54 to output a simulation result 55.

The acceptance/rejection determining section 105 receives the simulation result 55 and verification item list 53 to perform acceptance/rejection determination, and outputs a result report 56 including notation of "◯" and "X" and a result of counting acceptances and rejections.

Figure 5:
FIG. 5 is an illustration showing contents of a result report.

FIG. 5 shows contents of the result report 56. In FIG. 5, "◯" denotes acceptance, while "X" denotes rejection. "TR", "WIDTH" and "SWIDTH" denote types of verification and "X18.138_PLUS", "OUT1", "XZ19.OUTB" and "X18.OUTB" denote signal names to be verified. Moreover, in FIG. 5, a result of counting the number of accepted and rejected signals is shown below the result report 56.

As already described, in the case of a conventional apparatus, it is necessary for a designer to manually generate a simulation input pattern and moreover, to visually confirm the output waveform of each signal in the acceptance/rejection determination of a simulation result. Therefore, the designer is burdened with these operations. On the contrary, the apparatus of this embodiment has functions for automatically obtaining a signal name required for verification, automatically generating a simulation input pattern for verification, and outputting an acceptance/rejection result of a simulation result, by using the function of a generator for generating the entire circuit diagram in accordance with basic cells arranged as tiles with a verification symbol previously added to a signal to be verified in the basic cells.

Thereby, it is possible to automatic verification, prevent a mistake due to visual observation, realize high-speed verification, and reduce the work load of a designer for verification.

(Examples of Specific Verification Symbols)

Some examples of specific verification symbols are described below.

<Verification Symbol 1>

Figure 6A:
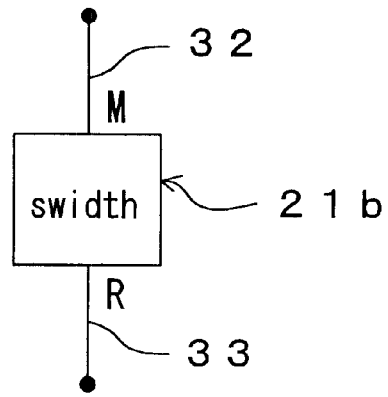
FIG. 6A is an illustration for explaining a verification symbol (example 1) for verifying two signals in the same basic cell.
Figure 6B:
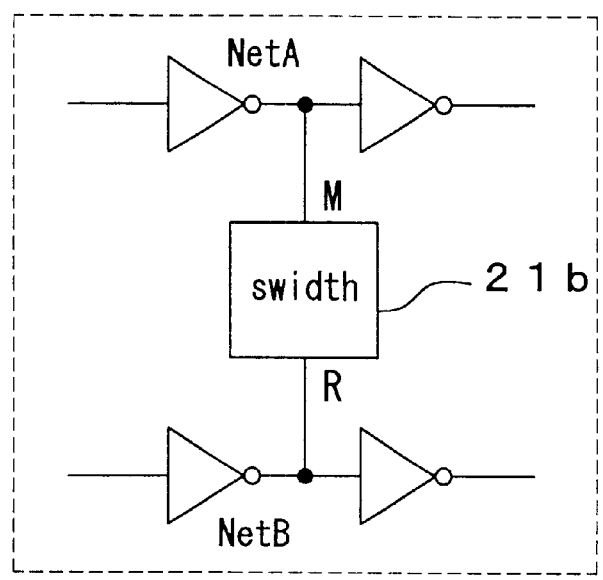
FIG. 6B is an illustration showing a basic cell into which the verification symbol (example 1) is inserted.

FIG. 6A shows a verification symbol for verifying a skew between two signals in the same basic cell. The verification symbol 21b is a symbol for measuring the skew between timings of first and second signals and determining acceptance or rejection in accordance with whether the skew is equal to or larger than a determination value. The verification symbol 21b has a connection terminal 32 to be connected to a fist signal and a connection terminal 33 to be connected to a second signal. The verification symbol 21b is used in connection with two signals to be measured in a basic cell as shown in FIG. 6B. Though not illustrated in FIG. 6B, a verification condition and a determination value are designated to the verification symbol 21b (the same is true for the following examples).

<Verification Symbol 2>

Figure 7A:
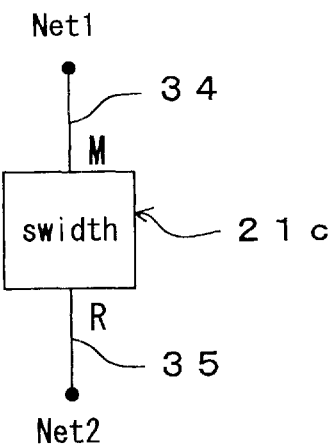
FIG. 7A is an illustration for explaining a verification symbol (example 2) for verifying two signals in different basic cells.
Figure 7B:
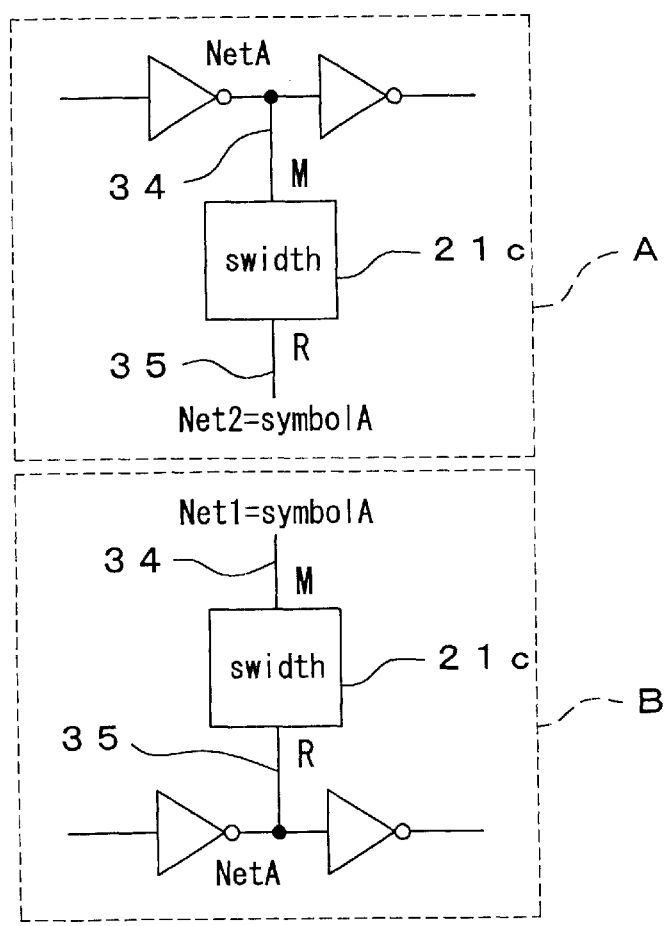
FIG. 7B is an illustration showing a basic cell into which the verification symbol (example 2) is inserted.

FIG. 7A shows a verification symbol for verifying the skew between signals of different cells. The verification symbol 21c has a connection terminal 34 to be connected to a signal to be measured in one basic cell and a connection terminal 35 to be connected to a signal to be measured in another basic cell. As shown in FIG. 7B, the verification symbol 21c is connected to signals to be measured in two different basic cells A and B to verify whether the signals meet predetermined conditions. The connection terminals 34 and 35 have properties (Net1 and Net2) serving as virtual label names for defining connection destinations.

As shown in FIG. 7B, the connection terminal 34 of the verification symbol 21c is connected to a signal (NetA) in one basic cell A but the connection terminal 35 is not connected to a signal. In the connection terminal 35, the property (Net2) is defined which designates a signal to be measured to which the connection terminal 35 is connected in the other basic cell B. In this case, a label "symbolA" is added to the signal to be measured, and a property is defined in the form of "Net2=symbolA". Moreover, the property (Net1) for designating a signal to be measured to which the connection terminal 34 is connected is defined for the connection terminal 34 of the verification symbol 21c in the other basic cell B. In this case, the property is defined in the form of "Net1=symbolA" by using a label name same as the signal label name (symbolA) for the property (Net2) defined in the basic cell A. Thus, by defining the property with the same label name in the connection terminals 34 and 35, signals between different cells are related.

The verification-node and verification-condition extracting section 102 retrieves verification symbols included in the circuit schematic 52 while sequentially analyzing the schematic 52 starting from the highest-order layer. When, for example, the verification symbol 21c of the basic cell A shown in FIG. 7B is detected during the above period, the section 102 stores a signal name to be connected to the connection terminal 34 of the verification symbol 21c, a label name (symbolA) defined in the property (Net2) of the connection terminal 35, and verification contents of the verification symbol 21c in a predetermined storage area. The section 102 further sequentially inspects the circuit schematic. When the definition with the label name to be "symbolA" is detected, verification contents of the verification symbol is determined. When the verification contents are the same as those previously stored, the verification item list 53 is generated by using the signal name previously stored and the signal name detected currently as signals to be measured.

As described above, providing a property for the connection terminal of a verification symbol allows verification between symbols defined in different cells to be realized.

<Verification Symbol 3>

Figure 8A:
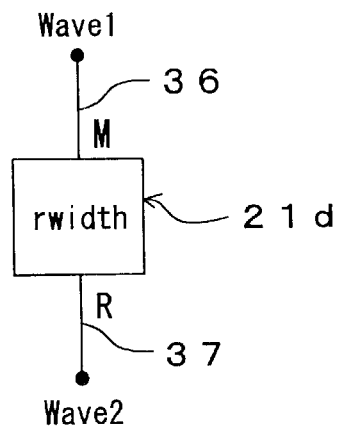
FIG. 8A is an illustration for explaining a verification symbol (example 3) to be connected to an existing waveform signal (waveform file)

FIG. 8A shows a verification symbol having a function capable of designating the waveform data prepared as one signal when comparing and verifying two signals.

A verification symbol 21d has connection terminals 36 and 37 to be connected to a signal to be measured, and has, in the terminals 36 and 37, properties (Wave1 and Wave2) for defining names of waveform signals previously registered as external files.

Figure 8B:
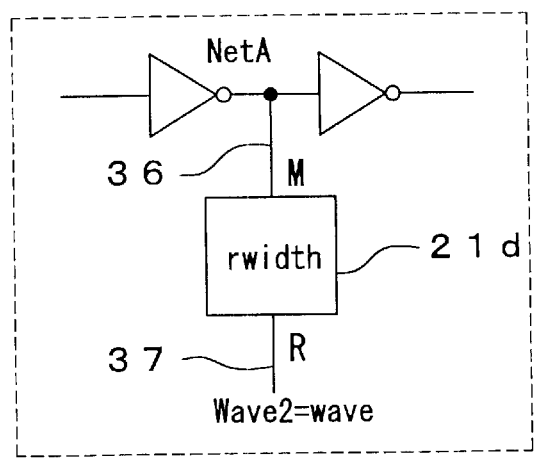
FIGS. 8B and 8C are illustrations showing basic cells into which a verification symbol (example 3) is respectively inserted.

The verification symbol 21d is used for a basic cell, for example, as shown in FIG. 8B. In FIG. 8B, the connection terminal 36 of the verification symbol 21d is connected to a signal (NetA). Though a signal is not connected to the connection terminal "wave" is defined for the property (Wave2) instead. The signal file of a signal to be compared with the signal to be measured (NetA) is specified by the "wave".

Figure 8C:
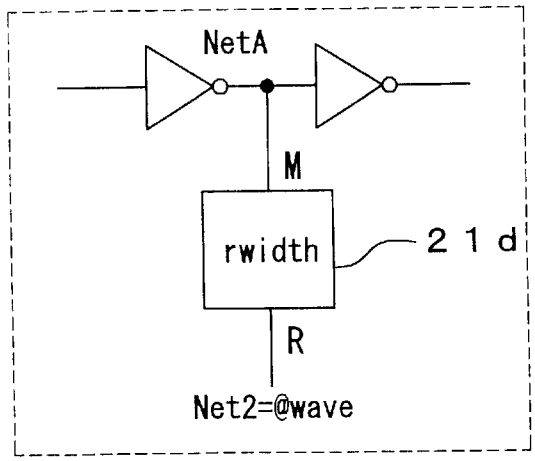

It is noted that a property may be defined as shown in FIG. 8C. That is, when adopting the notation "@xxx" by using the symbol "@", a signal name "xxx" is searched in other basic cell to use a signal having the searched signal name for comparison with a signal to be measured.

Thus, the verification symbol 21d makes it possible to obtain a signal waveform by defining the waveform name of a registered waveform file as the property of a connection terminal instead of connecting the connection terminal of a verification symbol to a signal.

Figures 9A, 9B:
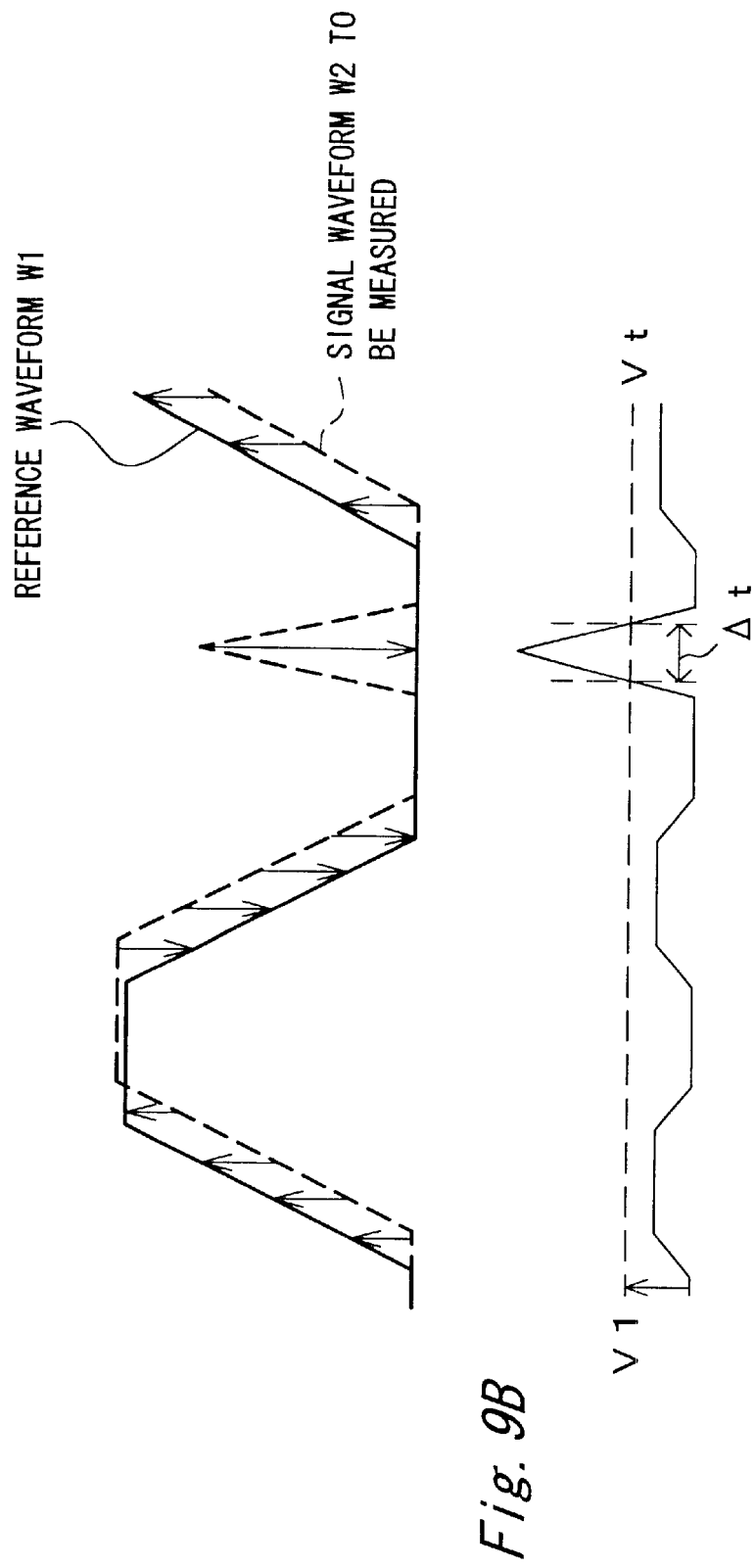
FIGS. 9A and 9B are illustrations for explaining an acceptance/rejection determining method when comparing a signal to be measured with an existing waveform signal.

In the case of the verification symbol 21d, verification of a measured signal on the basis of an external waveform can be performed as described below. As shown in FIG. 9A, when comparing a reference waveform W1 which is an external waveform with a signal waveform W2 to be measured, the difference voltage V1 between the waveforms W1 and W2 is obtained as shown in FIG. 9B. If the time in which the difference voltage V1 exceeds an allowable value Vt does not exceed a predetermined spike generation time Δt, it is determined to be acceptance.

<Verification Symbol 4>

Figure 10A:
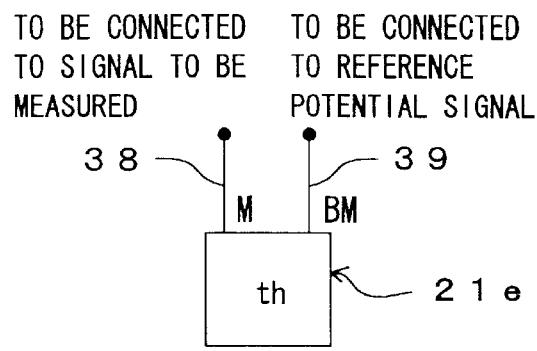
FIG. 10A is an illustration for explaining a verification symbol (example 4) to be connected to an optional reference-potential signal.

FIG. 10A shows a verification symbol having a function capable of optionally designating a reference potential for measuring a signal. Though a reference potential for measuring a signal generally uses a ground potential, a verification symbol 21e makes it possible to use an optional potential designated instead of the ground potential as the reference potential. The verification symbol 21e has a connection terminal 38 to be connected to a signal to be measured and a connection terminal 39 for connecting a reference potential signal. According to the verification symbol 21e, a signal to be connected to the connection terminal 38 is measured by using a signal (reference potential signal) connected to the connection terminal 39 as a reference potential and the result is output.

Figure 10B:
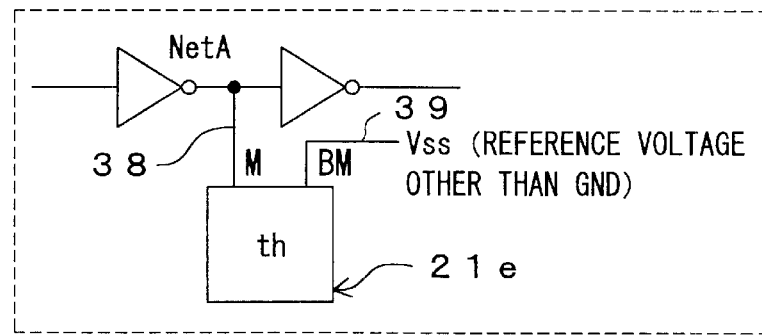
FIG. 10B is an illustration showing a basic cell into which the verification symbol (example 4) is inserted.

FIG. 10B shows a basic cell to which the verification symbol 21e is added. In this case, a signal Vss connected to the connection terminal 39 provides a reference potential.

Figure 10C:
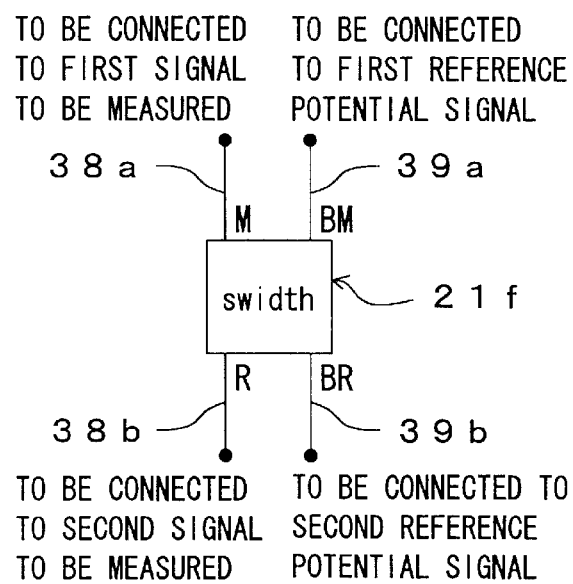
FIG. 10C is an illustration for explaining another example of a verification symbol (example 4).

Moreover, in verification symbols for comparing two signals such as the above-described verification symbols 21b, 21c, and 21d, terminals 38b and 39b to be connected to reference potential signals may be provided to terminals 38a and 39a to be connected to signals to be measured, as shown in FIG. 10C.

<Verification Symbol 5>

Figure 11A:
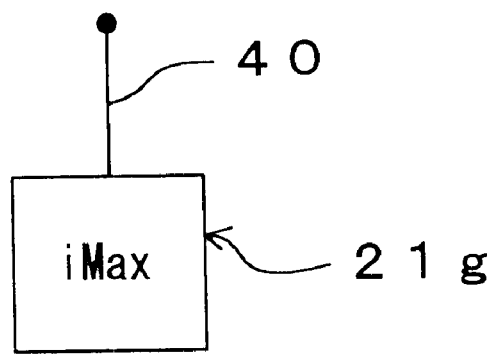
FIG. 11A is an illustration for explaining a verification symbol (example 5) for verifying an instance.
Figure 11B:
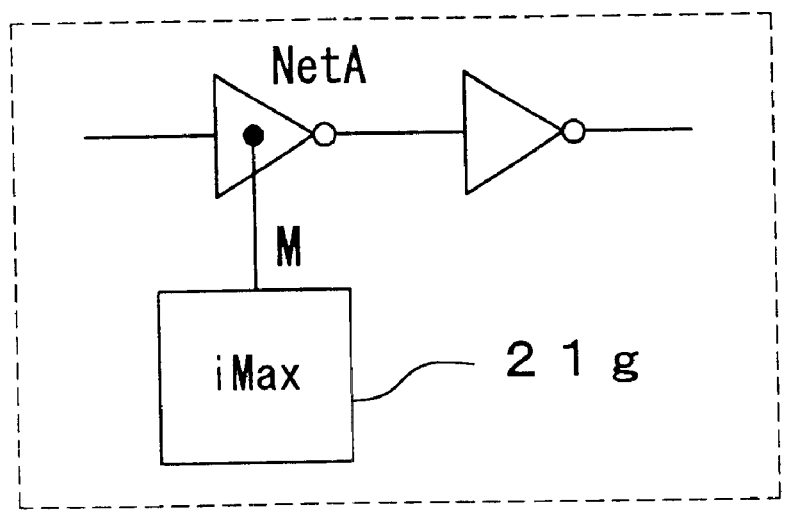
FIG. 11B is an illustration showing a basic cell into which the verification symbol (example 5) is inserted.

FIG. 11A shows a verification symbol for measuring not a signal voltage but a current value flowing through an instance. A verification symbol 21g which is connected to not the net but the instance can provide measurement of peek value and average value of current flowing through the instance with respect to the ground. It is possible to measure the peak value and average value of the current flowing through the instance. Conventionally, a designer has generated a circuit schematic of the whole circuit and examined a decided instance name, and then started measurement similarly to the case of determination of a voltage value. However, adding previously the verification symbol 21g to a basic cell allows a current value of the instance to be automatically determined. FIG. 11B shows a basic cell to which the verification symbol 21g is added. For example, a determination value for a current in the verification symbol 21g is set, and then it is determined whether the peak value or average value of a current flowing through the instance exceeds the determination value.

Second Embodiment

The verifying apparatus of this embodiment has functions for further automatically analyzing a result report generated by the acceptance/rejection determining section 105, specifying rejected portions, and highlighting the rejected portions on the whole circuit schematic in addition to the functions of the first embodiment for display.

Figure 12:
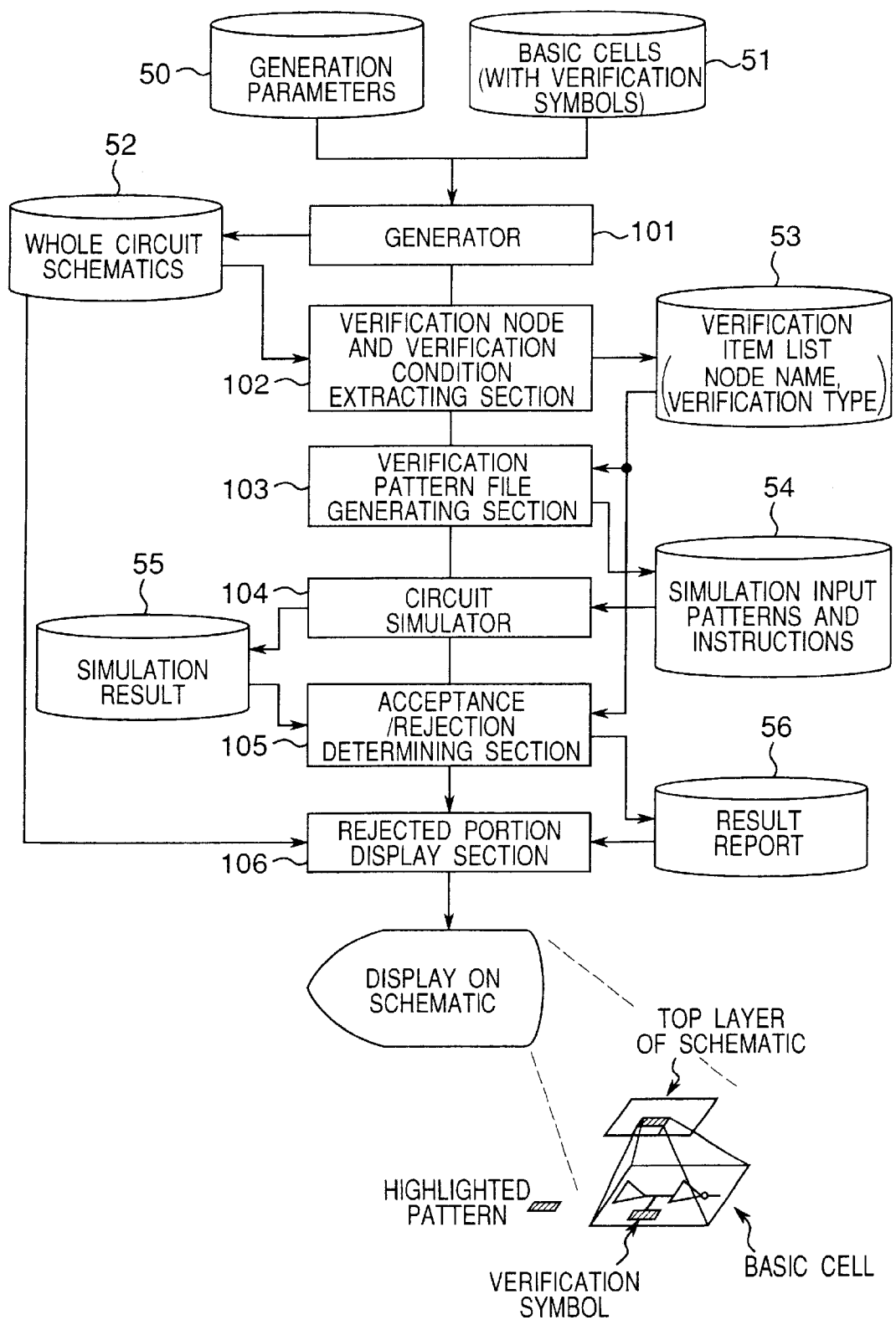
FIG. 12 is a block diagram of an verifying apparatus of the present invention (second embodiment).

FIG. 12 shows a configuration of the verifying apparatus of this embodiment. The verifying apparatus of this embodiment is further provided with a rejected portion display section 106 in addition to the configuration of the apparatus of the first embodiment.

The rejected portion display section 106 refers to a result report 56, specifies a rejected verification symbol in accordance with the signal name of an acceptance/rejection determination result and the type of verification, and highlights the rejected verification symbol on the whole circuit schematic 52 for display. In this case, as shown at the bottom of FIG. 12, the section 106 displays with highlight not only a rejected verification symbol but also a circuit schematic higher than the circuit schematic including the rejected verification symbol. Thereby, even when circuit schematics are hierarchical, it is possible to recognize a rejected portion as a whole.

Third Embodiment

Figure 13:
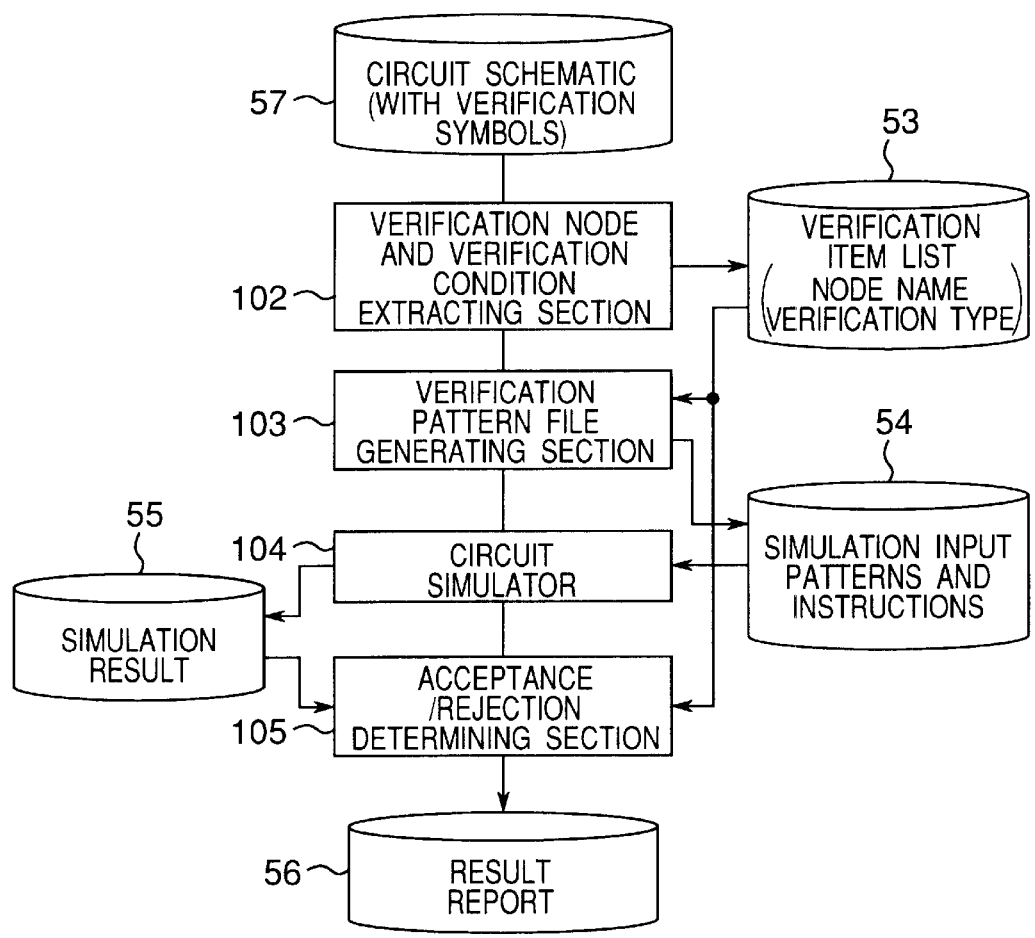
FIG. 13 is a block diagram of an verifying apparatus of the present invention (third embodiment).
Figure 14:
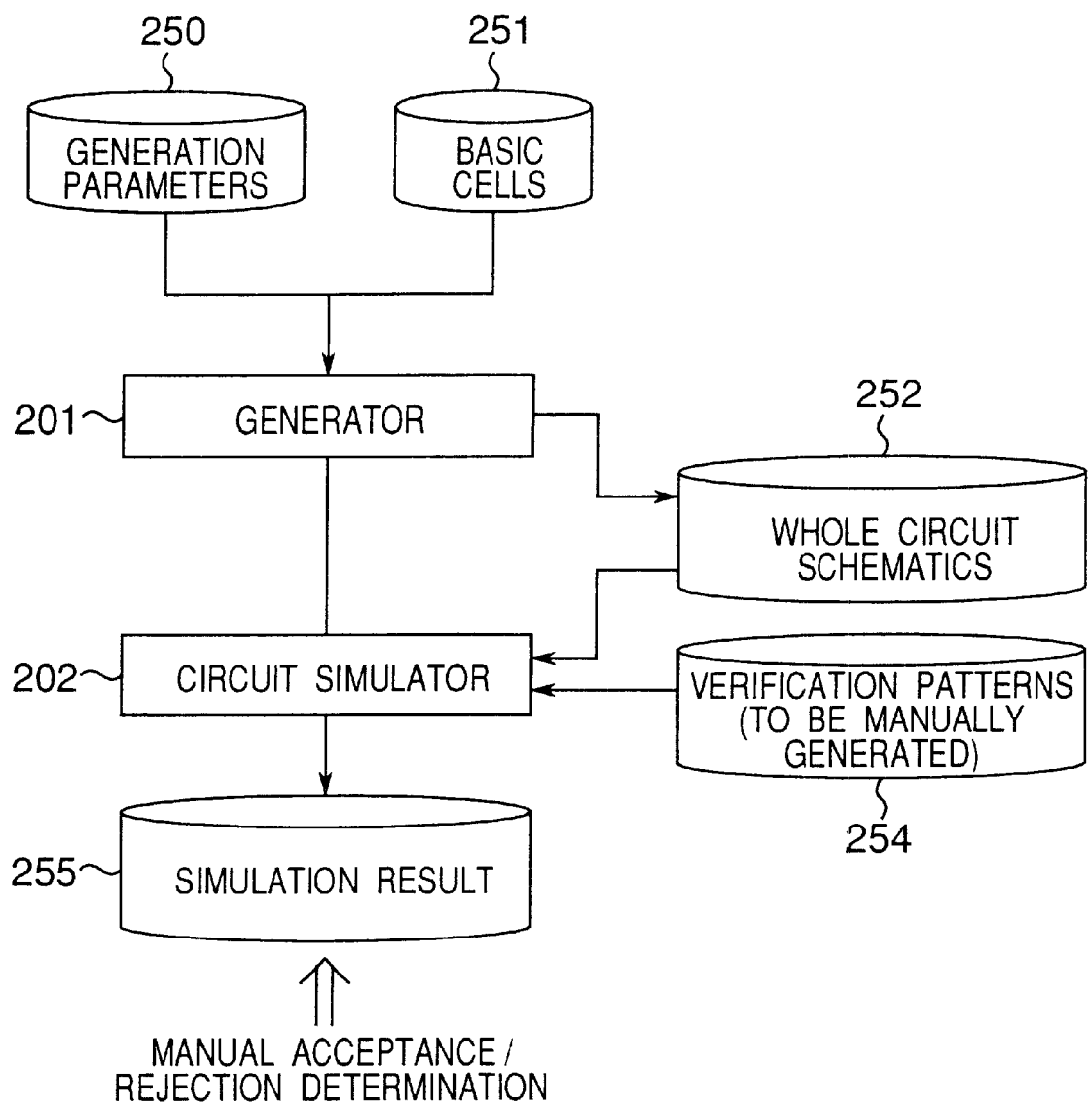
FIG. 14 is a block diagram of a conventional verifying apparatus.

FIG. 13 shows a configuration of the verifying apparatus of the third embodiment of the present invention.

In the case of the verifying apparatus of the above-described embodiments, the generator 101 generates the whole circuit schematic 52 in accordance with the arrangement of basic cells to which a verification symbols are added, analyzes the whole circuit schematic 52, and generates the verification item list 53. On the contrary, the verifying apparatus of this embodiment generates the verification item list 53 in accordance with an optional circuit schematic to which a verification symbols are added without using the arrangement of basic cells.

In the case of the verifying apparatus of this embodiment, operations of a verification-node and verification-condition extracting section 102, a verification-pattern-file generating section 103, a circuit simulator 104, and an acceptance/rejection determining section 105 are the same as operations of those of the above embodiments.

Thus, even when directly providing a circuit schematic without using the arrangement of basic cells as circuit design information, adding previously the above verification symbol in the circuit schematic can provide subsequent automatic verification similarly to the case of the above embodiments.

Also for the verifying apparatus of this embodiment, various verification symbols shown for the first embodiment can be used. For example, the verification symbols 21c and 21d can be used. In this case, the verification symbols 21c and 21d perform verification between two different signals independently of the same or different cells.

Although the present invention has been described in connection with specified embodiments thereof, many other modifications, corrections and applications are apparent to those skilled in the art. Therefore, the present invention is not limited by the disclosure provided herein but limited only to the scope of the appended claims.

What is claimed is:

1. An apparatus for automatically verifying a designed circuit which is generated by a generator for generating a circuit diagram of a whole semiconductor integrated circuit in accordance with an arrangement of cells which are regarded as parts, each cell defining a predetermined circuit unit, wherein a verification symbol which specifies a node name and a verification content for a node to be verified is inserted in advance into at least one of the cells arranged as parts, and wherein the apparatus comprises:

verification-condition extracting section for analyzing a circuit diagram of the whole semiconductor integrated circuit generated in accordance with the arrangement of cells including at least one verification symbol, and extracting the node name and the verification content of the node to be verified;

pattern generating section for generating a verification pattern to be used for verification from the extracted node name and verification content; and acceptance/rejection determining section for executing a circuit simulation by using the verification pattern, analyzing the simulation result, and determining whether the verified node is of acceptance or rejection.

2. The apparatus according to claim 1, wherein the acceptance/rejection determining section outputs a report including a determination result indicative of acceptance or rejection.

3. The apparatus according to claim 1, wherein in order to verify a skew between two signals connected to two nodes included in the same cell, the verification symbol has a first connection terminal to be connected to one of the signals and a second connection terminal to be connected to the other of the signals.

4. The apparatus according to claim 1, wherein the verification symbol has a connection terminal for designating predetermined waveform data to be compared with a signal to be measured.

5. The apparatus according to claim 1, wherein the verification symbol measures a period in which voltage difference between two signals to be compared in verification becomes a predetermined value or more, and determines acceptance or rejection in accordance with whether the length of period is equal to or shorter than a predetermined length.

6. An apparatus for automatically verifying a designed semiconductor integrated circuit specified in accordance with circuit information, wherein at least one verification symbol which specifies a node name and a verification content for a node to be verified in the circuit is inserted in advance into the circuit information of the semiconductor integrated circuit, and wherein the apparatus comprises:
verification-condition extracting section for analyzing a circuit information including the verification symbol, and extracting the node name and verification content of the node to be verified;
pattern generating section for generating a verification pattern to be used for verification from the extracted node name and verification content; and
acceptance/rejection determining section for executing a circuit simulation by using the verification pattern, analyzing the simulation result, and determining whether the verified node is of acceptance or rejection.

7. The apparatus according to claim 6, wherein the acceptance/rejection determining section outputs a report including a determination result indicative of acceptance or rejection.

8. The apparatus according to claim 6, wherein in order to verify a skew between two signals connected to two nodes, the verification symbol has a first connection terminal to be connected to a first signal to be verified and a second connection terminal to be connected to a second signal to be verified.

9. The apparatus according to claim 6, wherein the verification symbol has a connection terminal for designating predetermined waveform data to be compared with a signal to be measured.

10. The apparatus according to claim 6, wherein the verification symbol measures a period in which the voltage difference between two signals to be compared in verification becomes a predetermined value or more, and determines acceptance or rejection in accordance with whether the length of period is equal to or shorter than a predetermined length.

11. A method of automatically verifying a designed circuit which is generated by a generator for generating a circuit diagram of a whole semiconductor integrated circuit in accordance with an arrangement of cells which are regarded as parts, each cell defining a predetermined circuit unit,
wherein a verification symbol which specifies a node name and a verification content for a node to be verified is inserted in advance into at least one of the cells arranged as parts, and
wherein the method comprises:
analyzing a circuit diagram of the whole semiconductor integrated circuit generated in accordance with the arrangement of cells including at least one verification symbol, and extracting the node name and the verification content of the node to be verified;
generating a verification pattern to be used for verification from the extracted node name and verification content; and
executing a circuit simulation by using the verification pattern and then analyzing the simulation result to determine whether the verified node is of acceptance or rejection.

12. The method according to claim 11, further comprising outputting a report including a determination result indicative of acceptance or rejection.

13. The method according to claim 11, wherein in order to verify a skew between two signals connected to two nodes included in the same cell, the verification symbol has a first connection terminal to be connected to one of the signals and a second connection terminal to be connected to the other of the signals.

14. The method according to claim 11, wherein the verification symbol has a connection terminal for designating predetermined waveform data to be compared with a signal to be measured.

15. The method according to claim 11, wherein the verification symbol measures a period in which voltage difference between two signals to be compared in verification becomes a predetermined value or more, and determines acceptance or rejection in accordance with whether the length of period is equal to or shorter than a predetermined length.

16. A method of automatically verifying a designed semiconductor integrated circuit specified in accordance with circuit information,
wherein at least one verification symbol which specifies a node name and a verification content for a node to be verified in the circuit is inserted in advance into the circuit information of the semiconductor integrated circuit, and
wherein the method comprises:
analyzing a circuit information including the verification symbol, and extracting the node name and verification content of the node to be verified;
generating a verification pattern to be used for verification from the extracted node name and verification content; and
executing a circuit simulation by using the verification pattern and then analyzing the simulation result to determine whether the verified node is of acceptance or rejection.

17. The method according to claim 16, further comprising outputting a report including a determination result indicative of acceptance or rejection.

18. The method according to claim 16, wherein in order to verify a skew between two signals connected to two nodes, the verification symbol has a first connection terminal to be connected to a first signal to be verified and a second connection terminal to be connected to a second signal to be verified.

19. The method according to claim 16, wherein the verification symbol has a connection terminal for designating predetermined waveform data to be compared with a signal to be measured.

20. The method according to claim 16, wherein the verification symbol measures a period in which the voltage difference between two signals to be compared in verification becomes a predetermined value or more, and determines acceptance or rejection in accordance with whether the length of period is equal to or shorter than a predetermined length.

* * * * *